United States Patent
Momtaz et al.

(10) Patent No.: US 7,088,797 B2
(45) Date of Patent: Aug. 8, 2006

(54) PHASE LOCK LOOP WITH CYCLE DROP AND ADD CIRCUITRY

(75) Inventors: Afshin Momtaz, Irvine, CA (US); David Kyong-Sik Chung, Newport Beach, CA (US); Pang-Cheng Hsu, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 704 days.

(21) Appl. No.: 10/241,140

(22) Filed: Sep. 10, 2002

(65) Prior Publication Data

US 2004/0047440 A1    Mar. 11, 2004

(51) Int. Cl.
*H03D 3/24* (2006.01)
*H03L 7/06* (2006.01)

(52) U.S. Cl. .................... 375/376; 327/148; 327/157
(58) Field of Classification Search ................ 375/354, 375/371, 373–376, 295; 332/117, 118, 123, 332/126, 127; 455/141, 144, 146–148, 155–157; 327/141, 144, 146–148, 155–157; 370/503, 370/516
See application file for complete search history.

(56) References Cited

U.S. PATENT DOCUMENTS

| | | | | |
|---|---|---|---|---|
| 4,320,361 A | * | 3/1982 | Kikkert | 332/112 |
| 4,388,597 A | * | 6/1983 | Bickley et al. | 331/2 |
| 4,574,243 A | * | 3/1986 | Levine | 327/159 |
| 5,825,253 A | * | 10/1998 | Mathe et al. | 331/18 |
| 5,999,024 A | * | 12/1999 | Kang | 327/156 |
| 6,249,560 B1 | * | 6/2001 | Ichihara | 375/376 |
| 6,657,917 B1 | * | 12/2003 | Lever | 365/233 |
| 6,744,323 B1 | * | 6/2004 | Moyal et al. | 331/1 A |
| 6,853,222 B1 | * | 2/2005 | Sumi | 327/156 |
| 2002/0131541 A1 | * | 9/2002 | Soe et al. | 375/376 |
| 2003/0026368 A1 | * | 2/2003 | Subramoniam et al. | 375/354 |
| 2004/0042474 A1 | * | 3/2004 | Walker et al. | 370/412 |

* cited by examiner

*Primary Examiner*—Tesfaldet Bocure
*Assistant Examiner*—Vineeta Panwalkar
(74) *Attorney, Agent, or Firm*—Brake Hughes PLC (57) ABSTRACT

Phase locked loops that can adjust the frequency of a clock signal are provided. A transmitter adjusts its data transmission rate in response to the clock signal to accommodate different data transmission protocols. A phase locked loop can add or drop cycles from an input clock signal in response to one or more signals from a receiver. The signals from the receiver indicate the transmission rate of the incoming data signal. The phase locked loop can drop cycles from the clock signal to decrease the frequency of the clock signal. The transmitter then decreases its data transmission rate in response to the reduced frequency of the clock signal. The phase locked loop can also add cycles to the clock signal to increase the frequency of the clock signal. The transmitter increases its data transmission rate in response to the increased frequency of the clock signal.

26 Claims, 6 Drawing Sheets

* CASE 1 : NJO FIELD IS FILLED WITH DATA AND PJO IS EMPTY

FIG. 1A

* CASE 2 : NJO AND PJO FIELDS ARE BOTH EMPTY

FIG. 1B

* CASE 3 : NJO AND PJO FIELDS ARE BOTH FILLED WITH DATA

| NJO | PJO | ADD | DROP |
|------|------|-----|------|
| DATA | 0 | 0 | 0 |
| 0 | 0 | 0 | 1 |
| DATA | DATA | 1 | 0 |

PHASE LOCK LOOP WITH CYCLE DROP AND ADD CIRCUITRY

BACKGROUND OF THE INVENTION

The present invention relates to phase locked loop circuits, and more particularly, to phase locked loop circuits that are used to control the data rates of signal transmitters.

Phase locked loop circuits are well known to those of skill in the art. Phase locked loops circuits are used in signal processing applications.

A typical phase locked loop includes a phase detector, a charge pump, a loop filter, and a voltage controlled oscillator. The phase detector produces an output signal that is proportional to the phase difference between an input signal and a clock signal. The output signal of the phase detector is also proportional to the frequency difference between the input signal and the clock signal.

The charge pump and the loop filter together act as a low pass filter. The low pass filter filters the output signal of the phase detector to produce a DC voltage. The DC voltage is proportional to the phase difference between the input signals of the phase detector.

The oscillator outputs the clock signal. The phase of the clock signal is dependent on the output of the loop filter. The clock signal is provided to one of the input terminals of the phase detector. The phase detector compares the clock signal from the oscillator to the input signal of the phase locked loop. An amplifier may be used to step up the voltage at the output of the phase detector.

In some types of communication systems, data is transmitted with a predetermined structure called a frame. The frame contains a header section and a payload section. The actual data resides in the payload section. Different data transfer protocols may require a different amount of data bits in the frame. Data transmission from one such protocol to another can only be performed if the frame is adjusted.

Phase locked loop circuits may be used to generate a clock signal that is used by a transmitter to transmit data. It would therefore be desirable to provide a phase locked loop that can adjust the frame for particular data transmission protocols.

BRIEF SUMMARY OF THE INVENTION

The present invention includes phase locked loop (PLL) circuits that provide clock signals to transmitters. The PLL adjusts the clock frequency so that the transmitter can transmit the required number of bits in a given time period. This frequency adjustment enables the transmitter to accommodate different received protocols.

For example, when a received payload contains fewer bits, the phase locked loop of the present invention drops one or more cycles from the clock signal. Dropping cycles from the clock signal causes the transmitter data rate to slow down, and hence it accommodates the missing bits. On the other hand, when a payload contains more bits, the phase locked loop of the present invention adds one or more cycles to the clock signal. Adding cycles to the clock signal causes the transmitter data rate to increase, and hence it accommodates the additional bits. By adding or dropping cycles from the clock signal, a transmitter can transmit data according to variety of transmission protocols.

In one embodiment of the present invention, phase locked loops have a cycle drop circuit coupled to a first input of a phase and frequency detector. The cycle drop circuit can drop cycles from the clock signal in response to a drop signal.

In another embodiment, a cycle drop circuit can also be coupled to a second input of the phase and frequency detector. This cycle drop circuit can add a cycles to the clock signal in response to an add signal.

In still another embodiment, divider circuits can be placed in between each cycle drop circuit and each input to the phase and frequency detector to reduce the bandwidth of the phase locked loop. The divider circuits provide lower frequency signals to the inputs of the phase and frequency detector. By providing lower frequency signals to the phase and frequency detector, more cycles can be added to or removed from the clock signal.

In still another embodiment of the present invention, the phase locked loop is used as a frequency synthesizer where the output clock signal has a different frequency than the input clock signal.

In frequency synthesizers of the present invention, a cycle add/drop circuit is coupled to an input of the phase and frequency detector. This cycle add/drop circuit can add or drop cycles from the clock signal to alter the data transmission rate. Two separate divider circuits are coupled to each of the inputs to the phase and frequency detector. The two divider circuits accommodate the different frequencies of the input and output clock signals.

DETAILED DESCRIPTION OF THE INVENTION

Figure 1A:
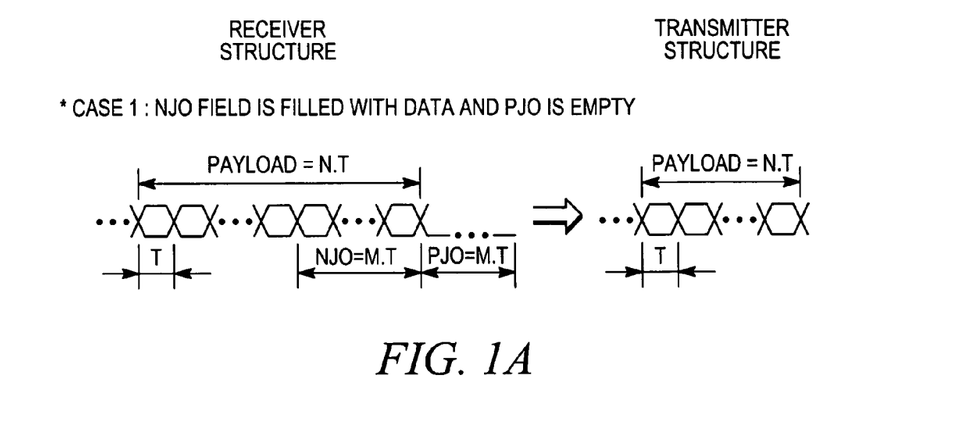
FIGS. 1A–1C illustrate timing diagrams for data signals processed by phase locked loops in accordance with the present invention.
Figure 1B:
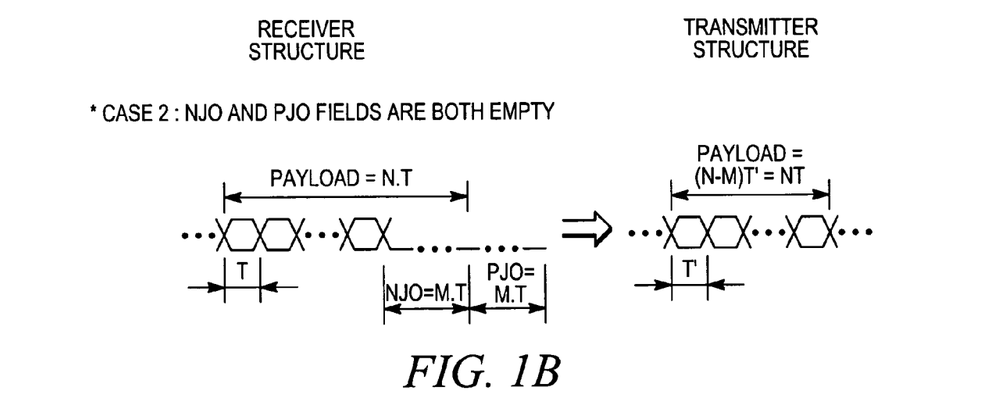
Figure 1C:
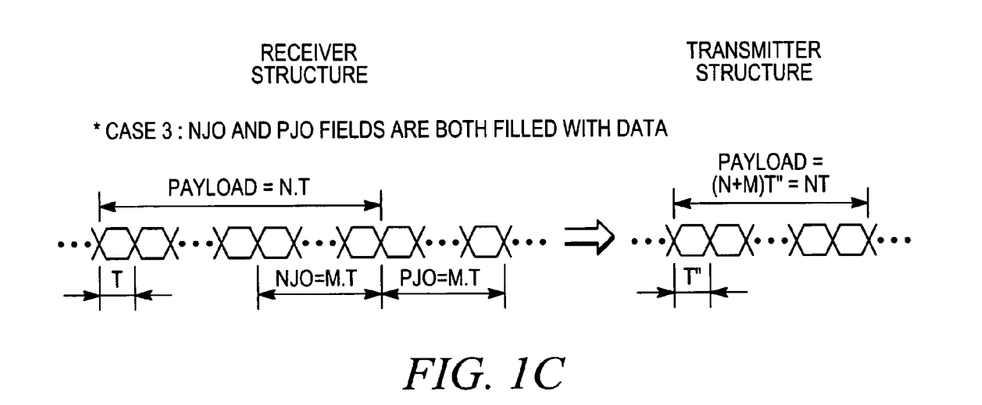

FIGS. 1A–1C illustrate a timing diagram for data signals in accordance with specific exemplary embodiments of the present invention. In FIGS. 1A–1C, data signals received by a receiver are illustrated on the right side of each figure, and data signals transmitted by a transmitter are illustrated on the left side of each figure.

The data signals are broken down in frames. Each frame includes a header and a payload. The number of bits contained in the header and the payload varies from one protocol to another. In accordance to the present invention, the transmitter can operate with received payloads of various lengths.

In FIGS. 1A–1C, the payload of the received signal contains N bits each having a period T, and the transmitter has to transmit the entire received data in N*T period. Moreover, the received payload includes an M bit long field called the Negative Justification Opportunity (NJO), and the header contains another M bit long field call the Positive Justification Opportunity (PJO). These fields can be used to vary the amount of transferred data by leaving them empty or by placing data bits in them.

For example, in case of FIG. 1A, NJO field is filled with data while PJO is left empty. As a result, the total received data bits are N bits. Because the transmitter has a fixed period (N*T) to transmit the entire data, the transmit data rate equals the received data rate (1/T).

In the next example shown in FIG. 1B, M bits of the NJO along with M bits of the PJO are left empty to accommodate a protocol with less data in the payload of each frame. Thus, the total received data bits are N−M. In response, the transmitter has to slow down its data rate to transmit only N−M bits in its fixed N*T period. In this case, the transmitter bit period is increased to T'=N*T/(N−M).

In the last example shown in FIG. 1C, both PJO and NJO fields are filled with data, and the total received data bits are N+M bits. As a result, the transmitter needs to increase its data rate to be able to transmit all the N+M bits in the N*T period. In this case, the transmit bit period is reduced to T"=N*T/(N+M).

Furthermore, since the status of NJO and PJO fields can change from one frame to another, the transmitter needs to increase or decrease its data rate from one frame to another as well.

The receiver can indicate to the transmitter to decrease its data rate in the case of the example shown in FIG. 1B, or to increase its data rate in the case of the example shown in FIG. 1C. The receiver outputs two data bits ADD and DROP that indicate whether data resides in the NJO and PJO fields. The truth table shown in FIG. 3 summarizes the relationship between data bits in the PJO and NJO field and the ADD and DROP data bits.

Figure 3:
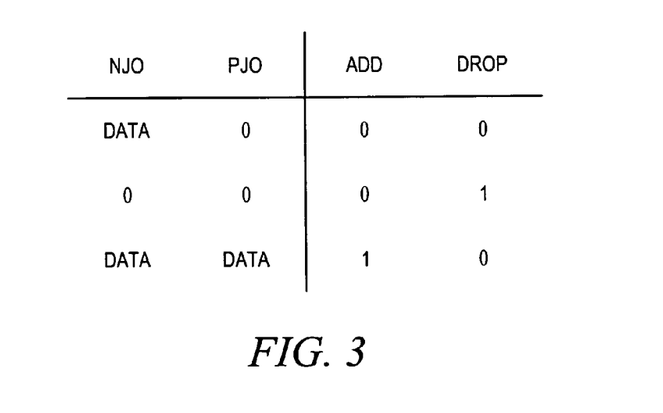
FIG. 3 illustrates add/drop truth table based on the content of a frame in accordance with the present invention.

If the NJO and PJO fields of a payload do not contain data, the receiver sends the DROP data bit to the transmitter but not the ADD data bit as shown in FIG. 3. The DROP data bit indicates that the data transfer rate at the transmitter needs to be decreased.

If the NJO and PJO fields of a payload both contain data, the receiver sends the ADD data bit to the transmitter but not the DROP data bit as shown in FIG. 3. The ADD data bit indicates that the data transfer rate at the transmitter needs to be increased.

If the NJO field contains data bits and the PJO field does not contain data, the receiver does not output the ADD or the DROP signals. In this case, the data transfer rate at the transmitter remains constant.

The ADD and the DROP signals are sent from the receiver to a phase locked loop of the present invention. The phase locked loop outputs a clock signal to the transmitter. The clock signal indicates to the transmitter what the data rate of the data signal should be.

A phase locked loop according to one embodiment of the present invention can add or drop cycles from the clock signal sent to the transmitter. The clock signal output of the phase locked loop indicates whether the data signal has data in the NJO and PJO fields. Based on information provided by the clock signal, the transmitter can increase or decrease its data rate to match different data transfer protocols. Any number of bits M can be added to or removed from a payload to accommodate various data transfer protocols.

Figure 2:
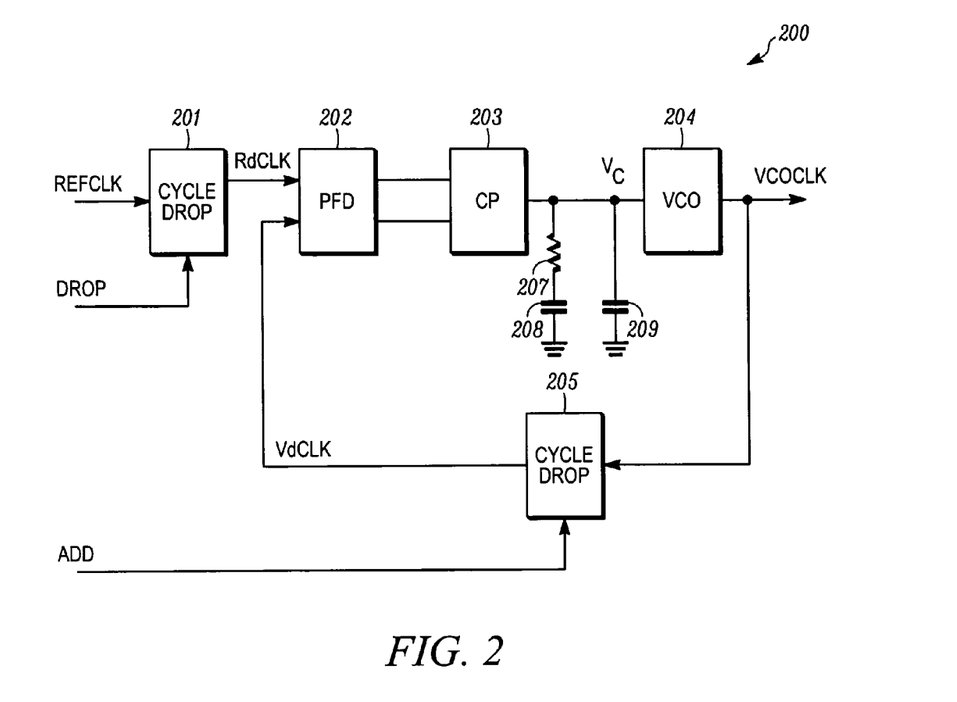
FIG. 2 illustrates a phase locked loop with cycle drop circuits according to the present invention.

FIG. 2 illustrates an example of a phase locked loop circuit of the present invention. Phase locked loop circuit 200 includes cycle drop circuits 201 and 205, phase and frequency detector 202, charge pump circuit 203, capacitors 208 and 209, resistor 207, and voltage controlled oscillator 204. Cycle drop blocks 201 and 205 can cause cycles to be dropped from the clock signal Refclk and output signal Vcoclk, respectively. The frequency of clock signal Vcoclk changes based upon whether data resides in the NJO and the PJO fileds of each payload.

Figure 4:
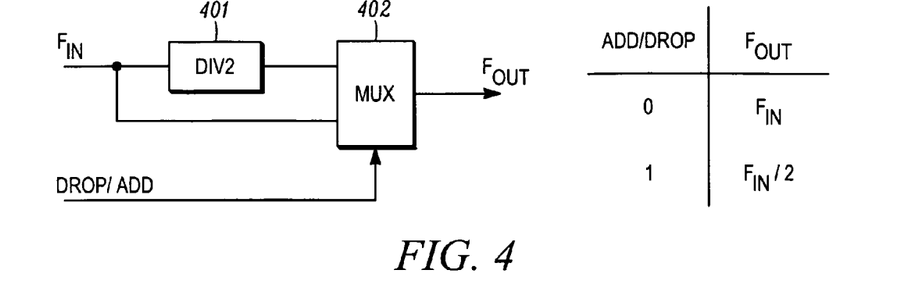
FIG. 4 illustrates a cycle drop block diagram and its truth tables in accordance with the present invention.

FIG. 4 illustrates a more detailed diagram of cycle drop circuits 201 and 205. Cycle drop circuits 201 and 205 include a divider circuit 401 and a multiplexer 402. Divider circuit 401 divides the frequency $F_{IN}$ of the input signal in half to provide $F_{IN}/2$. $F_{IN}/2$ has twice the period and half the frequency of $F_{IN}$. Multiplexer 402 selects $F_{IN}$ or $F_{IN}/2$ depending upon the state of the select signal DROP or ADD.

In the case of drop circuit 201, the select input of multiplexer 402 is coupled to the DROP signal. When DROP is 0 (i.e., LOW), the frequency $F_{OUT}$ of the output signal of multiplexer 402 equals the frequency $F_{IN}$ of the input signal. When DROP is 1 (i.e., HIGH), the frequency $F_{OUT}$ of multiplexer 402 equals one half ($F_{IN}/2$) the frequency of the input signal.

In the case of drop circuit 205, the select input of multiplexer 402 is coupled to the ADD signal. When ADD is 0 (i.e., LOW), the frequency $F_{OUT}$ of the output signal of multiplexer 402 equals the frequency $F_{IN}$ of the input signal. When ADD is 1 (i.e., HIGH), the frequency $F_{OUT}$ of the output signal of multiplexer 402 equals one half ($F_{IN}/2$) the frequency of the input signal.

Figure 5:
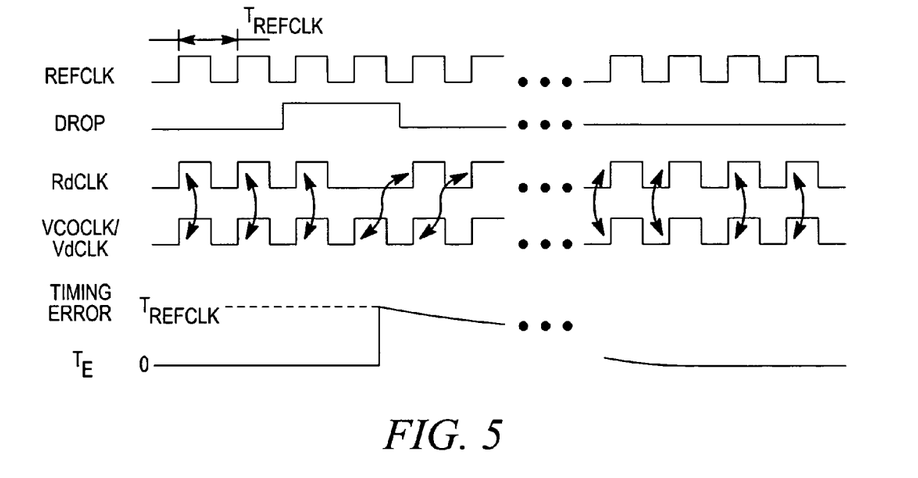
FIG. 5 illustrates a timing diagram of signals in a phase locked loop with cycle add/drop features in accordance with the present invention.

FIG. 5 is a timing diagram showing example signals that illustrate the operation of phase locked loop circuit 200. Voltage signal Refclk is the input clock signal to phase locked loop circuit 200. The period of Refclk is $T_{REFCLK}$ as shown in FIG. 5.

Signal Rdclk is a first input to phase and frequency detector circuit 202. When the DROP signal is LOW, cycle drop circuit 201 causes the frequency of Rdclk to equal the frequency of Refclk as shown in FIG. 5. Phase and frequency detector 202 compares input signals Rdclk and Vdclk to determine the difference between their phases.

Detector 202 outputs an alternating differential signal that indicates the difference between the phase and the frequency of signals Rdclk and Vdclk. Charge pump circuit 203 steps up the output voltage of detector 202. Charge pump 203 outputs a single ended high voltage signal.

Capacitors 208–209 and resistor 207 together with charge pump 203 form a low pass filter. The low pass filter circuit smoothes the output signal of charge pump 203 into a DC analog signal Vc.

Voltage controlled oscillator 204 outputs an alternating clock signal Vcoclk in response to the DC signal Vc. The period of signal Vcoclk is proportional to the DC level of Vc. Signal Vcoclk is the output signal of phase locked loop circuit 200 that is provided to the transmitter.

When the ADD signal is LOW, the output signal Vdclk of cycle drop circuit 205 equals its input signal Vcoclk. Phase and frequency detector 202 compares the phases and the frequencies of signals Rdclk and Vdclk as mentioned above. When these two signals have the same phase and frequency, the timing error signal $T_E$ shown in FIG. 5 equals zero. In this instance, the pulses of signals Rdclk and Vdclk are lined up as shown by the arrows on the left side of FIG. 5.

When the phase or frequency of signal Refclk varies, $T_E$ varies from zero. When voltage $V_C$ changes, voltage controlled oscillator (VCO) 204 changes the phase of signal Vcoclk to match the phase of signal Refclk. VCO 204 shifts the pulses of Vdclk until they are lined up with Rdclk. As the phase of Vcoclk and Vdclk approaches the phase of signal Refclk, $T_E$ moves back to 0.

When a data transmission protocol is used that does not require data bits in the NJO field, the receiver causes DROP signal goes HIGH. The DROP signal is then sent to phase locked loop 200. In the example of FIG. 5, the receiver logic makes the DROP signal equal to two pulse widths of signal Refclk. In other embodiments, the pulse width of the DROP signal may be longer or shorter. The pulse width of the Drop signal corresponds to the number of data bits that are missing from the NJO field.

When the DROP signal is HIGH, one clock cycle is dropped from signal Rdclk in the example of FIG. 5. Drop circuit 201 causes the frequency of Rdclk to be one half of Refclk, as discussed with respect to FIG. 4.

The pulse widths of signals Rdclk and Vcoclk/Vdclk are then offset by one period $T_{REFCLK}$ as shown in FIG. 5. When phase and frequency detector 202 senses the missing clock pulse, it causes the timing error signal $T_E$ to rise to $T_{REFCLK}$. $T_{REFCLK}$ equals the period of clock signal Refclk.

Voltage controlled oscillator 204 senses the rise in $T_E$ and decreases the frequency of signal Vcoclk (and Vdclk) in response. As shown by the arrows in FIG. 5, voltage controlled oscillator 204 causes the pulse widths of Vcoclk/Vdclk to move closer to the corresponding pulse widths of Rdclk over time. Thus, the period of Vcoclk increases and the frequency of Vcoclk decreases when the DROP signal is asserted.

As the pulse widths of Rdclk and Vdclk come closer to alignment, timing error signal $T_E$ decreases. Eventually, the pulse widths of Rdclk and Vdclk are aligned again, and the phases and frequencies of these two signal are equal. When the pulse widths are lined up, timing error signal $T_E$ equals zero. By asserting the Drop signal, the frequencies of Vcoclk and Vdclk decrease temporarily.

When the ADD signal is HIGH, one clock cycle is dropped from signal Vdclk. Drop circuit 205 causes the frequency of signal Vdclk to be half of the frequency of signal Vcoclk, as discussed with respect to FIG. 4.

After the cycle is dropped from Vdclk, the pulse widths of signals Rdclk and Vdclk are offset by one period $T_{REFCLK}$. When phase and frequency detector 202 senses the missing clock pulse, it causes the timing error signal $T_E$ to drop to $-T_{REFCLK}$.

Voltage controlled oscillator 204 senses the drop in $V_C$. In response, VCO 204 increases the frequency of signals Vcoclk and Vdclk. Voltage controlled oscillator 204 causes the pulse widths of Vdclk to move closer to the corresponding pulse widths of Rdclk over time.

As the pulse widths of Rdclk and Vdclk come closer to alignment, timing error signal $T_E$ rises back toward zero. Eventually, the pulse widths of Rdclk and Vdclk are aligned again, and the phases and frequencies of these two signal are equal. When the pulse widths are lined up, timing error signal $T_E$ equals zero. Thus, the Add signal causes the frequencies of signals Vcoclk and Vdclk to temporarily increase.

Clock signal Vcoclk indicates to the transmitter what the transmitter's data transfer rate should be. When the transmitter senses a drop in the frequency of Vcoclk, the transmitter decreases its data transfer to accommodate the reduced number of data bits (N–M) in the payload. When the transmitter senses an increase in the frequency of Vcoclk, the transmitter increases its data transfer rate to accommodate the increased number of data bits (N+M) in the payload.

After drop circuit 201 or drop circuit 205 remove a pulse width from Rdclk or Vdclk, phase locked loop 200 adjusts the phase of signal Vdclk to match the phase of Rdclk. The adjustment in the phase of Vdclk occurs over a period of time. This period of time is measured by the time its takes for $T_E$ to move from $T_{REFCLK}$ or $-T_{REFCLK}$ back to 0. This period of time is referred as the settling time. The bandwidth B of the phase locked loop determines the settling time.

Figure 6:
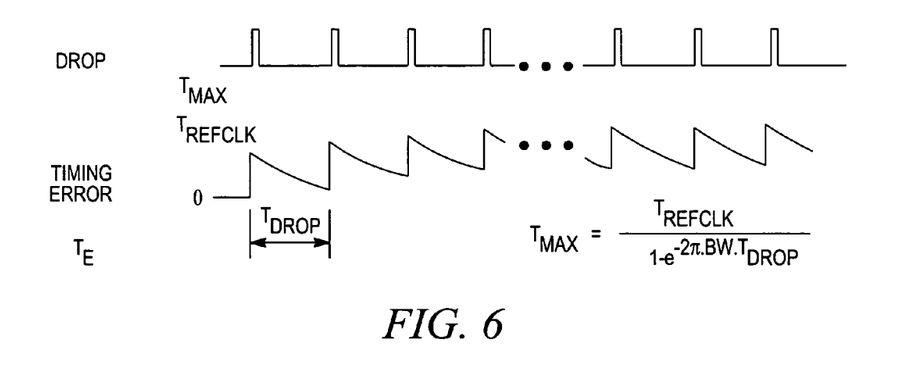
FIG. 6 illustrates a diagram that compares the cycle drop rate to the timing error signal of a phase locked loop according to the present invention.

The settling time creates an upper limit on how often the DROP signal can be asserted and how often the ADD signal can be asserted. FIG. 6 shows a timing diagram that illustrates an example of what happens when the DROP signal is continuously asserted before $T_E$ has reached zero.

In the example of FIG. 6, the DROP signal is asserted during each frame. Yet, the settling time $T_{DROP}$ is not short enough for $T_E$ to go to zero before the next drop signal is asserted. The instantaneous peak of $T_E$ during a cycle gradually rises until it reaches a maximum value $T_{MAX}$ as shown in FIG. 6. $T_{MAX}$ is determined by the following equation:

$$T_{\text{MAX}} = \frac{T_{REFCLK}}{1 - e^{-2\pi B T_{DROP}}} \quad (1)$$

where $T_{DROP}$ is the time difference between a peak in timing error signal $T_E$ and the next subsequent valley of $T_E$ as shown in FIG. 6. $T_{MAX}$ is the maximum value in the timing error signal $T_E$ shown in FIG. 6.

For the circuit of FIG. 2, if $T_{MAX}$ exceeds $T_{REFCLK}$, the phase locked loop is not able to match up corresponding pulse widths in signals Rdclk and Vdclk as shown in FIG. 6. Detector 202 therefore cannot correct for the error in excess of $T_{REFCLK}$. A small decrease in the period of Vdclk causes circuit 200 to fail, because the difference between the period of Vdclk and the period of Rdclk is greater than $T_{REFCLK}$.

Figure 7:
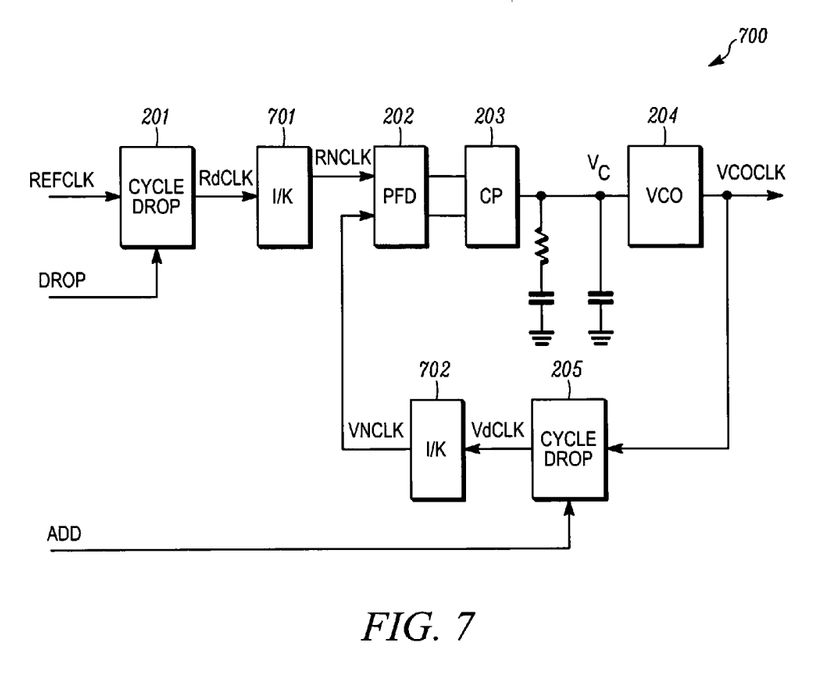
FIG. 7. illustrates a phase locked loop with cycle drop circuits and divider circuits according to the present invention.

FIG. 7 illustrates another example of a phase locked loop circuit. In circuit 700, phase detector 202 can match up corresponding pulse widths in Rdclk and Vdclk when timing error signal $T_E$ exceeds the period $T_{REFCLK}$ of Refclk.

In circuit 700, divider circuits 701 and 702 are coupled to each input terminal of phase and frequency detector 202. Divider circuit 701 is coupled between cycle drop circuit 201 and a first input to detector 202. Divider circuit 702 is coupled between drop circuit 205 and a second input to detector 202.

Divider circuit 701 divides the frequency of signal Rdclk by a ratio K. The divided down output signal of divider circuit 701 is signal Rnclk. The period of signal Rnclk is K times as long as the period of signal Rdclk.

Divider circuit 702 divides the frequency of signal Vdclk by the same ratio K. The divided down output signal of divider circuit 702 is signal Vnclk. The period of signal Vnclk is K times as long as the period of signal Vdclk.

Figure 8:
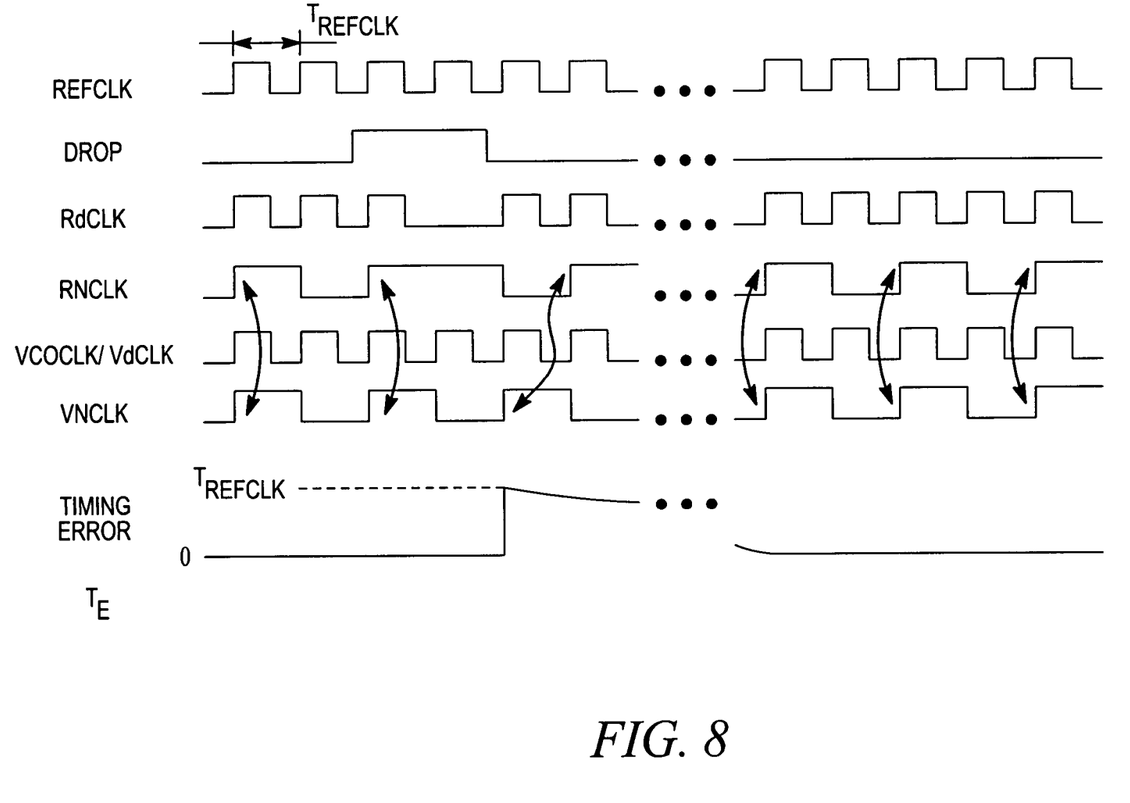
FIG. 8 illustrates a timing diagram of signals in a phase locked loop with cycle drop circuits and divider circuits according to the present invention.

FIG. 8 is a timing diagram that illustrates the operation of circuit 700. In the example shown in FIG. 8, K equals 2. Therefore, the period of Rnclk is twice as long as the period of Rdclk, and the period of Vnclk is twice as long as the period of Vdclk.

When the DROP signal is HIGH, one clock cycle is dropped from Refclk. Detector 202 compares Rnclk to Vnclk in circuit 700. Detector 202 causes timing error signal $T_E$ to increase to $T_{REFCLK}$ after the DROP signal is asserted.

Dropping one cycle from Refclk causes the phase of Vnclk to be offset from the phase of Rnclk by only one half of one period. If the period of Vnclk is smaller than the period of Rnclk, phase detector 202 is still able to match up corresponding pulse widths in Rnclk and Vnclk.

When a cycle is dropped from Refclk, the timing error signal increases to $T_{REFCLK}$ as shown in FIG. 8. Voltage controlled oscillator 204 increases the period of signals Vcoclk, Vdclk, and Vnclk until the pulse widths of signal Vnclk line up with the pulse widths of signal Rnclk, as shown by the arrows in FIG. 8. As this occurs, the timing error signal $T_E$ decreases back to zero.

As mentioned above, because of dividers 701 and 702, the period of signals Rnclk and Vnclk are increased by a factor of K. Since the phase and frequency detector 202 uses these two clocks signals, the PLL operates properly, if $T_E$ is smaller than the period of Rnclk and Vnclk ($K^*T_{REFCLK}$). In other words, dividers 701 and 702 allow $T_{MAX}$ to be as large as $K^*T_{REFCLK}$ before the PLL fails to operate.

For example, if the bandwidth of the phase locked loop is 500 Hz and $T_{DROP}$ is 100 μs, then using equation (1), $T_{MAX}$ can be calculated to be $2.5^*T_{REFCLK}$. Hence, K has to be at least as large as 3 (dividing by an integer is simpler than a non-integer, 2.5) in order to prevent the offset between pulses in Rnclk and Vnclk from exceeding the period of Rnclk.

In another embodiment, the number of cycles that are dropped in a cycle drop block is not limited to one cycle only. For example, the cycle drop circuit of FIG. 4 can be modified to add a second divider block that operates identically to divider 401. The second divider block is placed in series with divider block 401. Thus, the frequency of Refclk is divided in half once by divider 401 and a second time by the second divider. The frequency of the output signal of the second divider is one-fourth of the Refclk frequency.

Multiplexer 402 selects the output signal of the second divider in response to a drop signal. The period of Rdclk becomes four times the period of Refclk. The timing error signal $T_E$ increases to $3\ T_{REFCLK}$. Three cycles are dropped from Rdclk.

Multiplexer 402 also selects the output signal of the second divider in response to an add signal. The period of Vdclk becomes four times the period of Vcoclk. The timing error signal decreases to $-3\ T_{REFCLK}$. Three cycles are dropped from Vdclk. The divide ratio of blocks 701 and 702 must be at least 4 so that detector 202 can correct for the offset between Rnclk and Vnclk.

In other embodiments, the cycle drop circuit of FIG. 4 can include three or more dividers coupled in series to drop or add more cycles from Rdclk or Vdclk.

Figure 9:
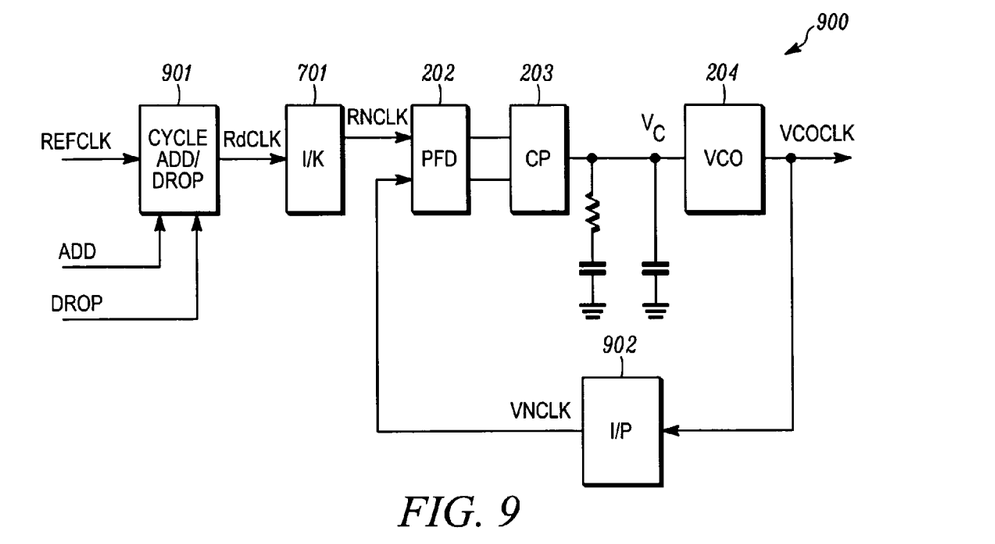
FIG. 9 illustrates a frequency synthesizer with a cycle add/drop circuit according to the present invention.

According to further embodiments, a phase locked loop of the present invention can be operated as a frequency synthesizer. According to these embodiments, the phase locked loop provides an output clock signal Vcoclk that has a different frequency than input clock signal Refclk at a steady state. FIG. 9 illustrates a phase locked loop circuit 900 according to this embodiment. Phase locked loop circuit 900 includes cycle add/drop circuit 901, divider circuit 701, detector 202, charge pump 203, oscillator 204, and divider 902.

Because Refclk and Vcoclk have different frequencies in circuit 900, cycle drop circuits 201 and 205 cannot be used to add and drop cycles from Refclk and Vcoclk as shown in FIGS. 2 and 7. In circuit 900, cycle add/drop circuit 901 can add or drop cycles from signal Refclk as shown in FIG. 9.

In another embodiment of the present invention, cycle add/drop circuit 901 is coupled between Vcoclk and the input of divider 902. Cycle add/drop circuit 901 can then add cycles to or drop cycles from the Vcoclk signal. In this embodiment, cycle add/drop circuit 901 is not coupled between Refclk and the input of divider 701 as shown in FIG. 9. Instead, Refclk is provided directly to the input of divider 701.

Because Vcoclk and Refclk have different frequencies in circuit 900, dropping a cycle from Vcoclk causes a different transmitter data rate than dropping a cycle from Refclk. Similarly, adding a cycle to Vcoclk in circuit 900 causes a different transmitter data rate than adding a cycle to Refclk.

Figure 10:
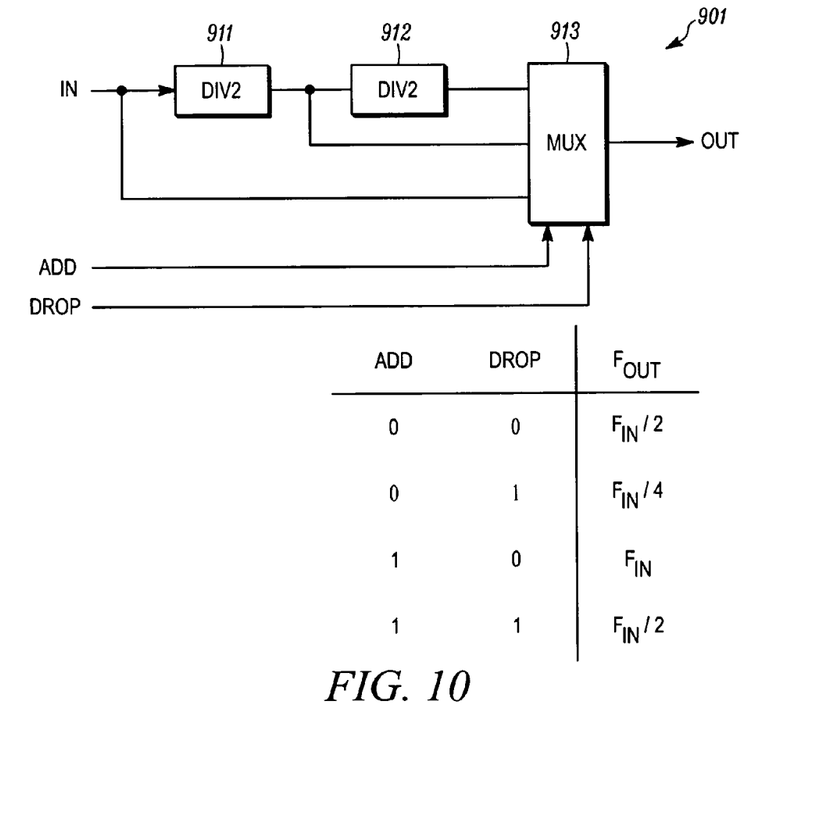
FIG. 10 illustrates the cycle add/drop circuit shown in FIG. 9 and its truth table.

FIG. 10 illustrates a more detailed diagram of cycle add/drop circuit 901. Circuit 901 includes two divider circuits 911–912 and a multiplexer circuit 913. Each of divider circuits 911–912 provides an output signal that has half the frequency of its input signal.

Circuit 901 shown in FIG. 10 can add cycles to and drop cycles from an input signal IN. The input signal IN can be signal Refclk or signal Vcoclk as discussed in the previous embodiments. Input signal IN is referred to below as Refclk for convenience only.

When the Add and Drop signals in FIG. 10 are both LOW (0) or both HIGH (1), cycle add/drop circuit 901 does not add or drop any cycles from Refclk. Multiplexer 913 selects the output signal of divider 911, which has half the frequency of Refclk.

In circuit 900, the frequency of Refclk is twice the frequency of Refclk in previous embodiments. Cycle add/drop circuit 901 divides the frequency of Refclk in half when the data length of the payload is unchanged (as in FIG. 1A) to obtain the proper frequency for Vcoclk.

In the embodiment where circuit 901 is coupled to the input of divider 902, the frequency of Vcoclk is twice the frequency of the desired output clock signal. Circuit 901 divides the frequency of Vcoclk in half when the data length of the payload is unchanged to obtain the proper frequency for Vcoclk. The frequency of Vcoclk is divided in half before it is provided to the data transmitter to obtain the correct output clock signal.

When the Drop is HIGH and the Add signal is LOW, cycle add/drop circuit 900 drops one cycle from Rdclk. During this frame, multiplexer 913 selects the output signal of divider circuit 912. The output signal of divider 912 has one-quarter of the frequency of Refclk. This causes one cycle to be dropped from Rdclk. The frequency of Vcoclk then decreases as discussed above in previous embodiments.

When the ADD signal is HIGH and the Drop signal is LOW, cycle add/drop circuit 900 adds one cycle to Rdclk. Multiplexer 913 selects input signal Refclk. Therefore, the output signal of multiplexer 913 has the same frequency as Refclk. This causes one cycle to be added to Rdclk with respect to the steady state. The frequency of Vcoclk increases as discussed above in previous embodiments.

In circuit 900, voltage controlled oscillator outputs a clock signal Vcoclk that has a different frequency than Refclk at a steady state. Detector 202 cannot line up the pulses in signals that have different frequencies. Therefore, signal Rnclk and Vnclk have to have the same frequency.

Divider circuit 902 divides the frequency of signal Vcoclk by a ratio P. The divider ratio P is selected so that frequency of Vnclk equals the frequency of Rnclk, when $T_E$ is at zero. When the error signal $T_E$ remains at zero, the rising edges of Rnclk line up with the rising edges of Vnclk in circuit 900.

In frequency synthesizer embodiments of the present invention, the frequency $F_{VCOCLK}$ of Vcoclk is related to the frequency $F_{REFCLK}$ of Refclk according to equation (2). K is the divider ratio of circuit 701, and P is the divider ratio of circuit 902.

$$F_{VCOCLK} = \frac{P * F_{REFCLK}}{K} \quad (2)$$

According to another embodiment of the present invention, cycle add/drop circuit 901 can be used when Refclk and Vcoclk have the same frequency. In this embodiment, the divide ratio K of divider 701 equals the divide ratio P of divider 902.

In another embodiment of the present invention, an amplifier may be included in the phase locked loop. In still further embodiments, phase locked loops of the present invention can be implemented in a single ended or in a differential form. Example of Fully Differential CMOS Phase-Locked Loops are discussed in commonly assigned U.S. patent application Ser. No. 09/919,636, filed Jul. 31, 2001, to Hairapetian et al., which is incorporated by reference herein.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A phase locked loop circuit comprising:
   a first cycle drop circuit that decreases the frequency of a first clock signal in response to a signal that indicates a reduced number of data bits in a frame;
   a phase detector circuit coupled to receive the first clock signal at a first input and a second clock signal at a second input;
   a low pass filter circuit that generates a filtered signal in response to an output signal of the phase detector; and
   an oscillator circuit that generates the second clock signal in response to the filtered signal.

2. The phase locked loop circuit of claim 1, wherein the low pass filter comprises a charge pump circuit and a loop filter.

3. The phase locked loop circuit of claim 1 wherein the cycle drop circuit comprises a divider circuit coupled to a multiplexer circuit.

4. The phase locked loop circuit of claim 1 further comprising:
   a second cycle drop circuit that decreases the frequency of the second clock signal in response to a signal that indicates an increased number of data bits in a frame.

5. The phase locked loop circuit of claim 4 wherein the second cycle drop circuit comprises:
   a divider circuit coupled to receive an output signal of the oscillator; and
   a multiplexer coupled to the divider circuit, wherein the multiplexer provides the second clock signal to the second input of the phase detector.

6. The phase locked loop circuit of claim 4 further comprising:
   a first divider circuit that decreases the frequency of the first clock signal by a first ratio, wherein the first divider circuit is coupled between the first cycle drop circuit and the phase detector.

7. The phase locked loop circuit of claim 6 further comprising:
   a second divider circuit that decreases the frequency of the second clock signal by a second ratio, wherein the second divider circuit is coupled between the second cycle drop circuit and the phase detector.

8. The phase locked loop circuit of claim 7 wherein the first ratio does not equal the second ratio, and the phase locked loop is a frequency synthesizer.

9. The phase locked loop circuit of claim 4 wherein the first cycle drop circuit comprises:
   first and second divider circuits coupled together, wherein each of the first and second divider circuits causes the frequency of the first clock signal to decrease; and
   a multiplexer having a first input coupled to the first divider circuit and a second input coupled to the second divider circuit.

10. The phase locked loop circuit of claim 9 further comprising:
    a third divider circuit that decreases the frequency of the first clock signal, wherein the third divider circuit is coupled between the first cycle drop circuit and the phase detector; and
    a fourth divider circuit that decreases the frequency of the second clock signal, wherein the fourth divider circuit is coupled between the second cycle drop circuit and the phase detector.

11. A phase locked loop circuit comprising:
    a phase detector circuit coupled to receive a first clock signal at a first input and a second clock signal at a second input;
    a low pan filter circuit that generates a filtered signal in response to an output signal of the phase detector;
    an oscillator circuit that generates the second clock signal in response to the filtered signal; and
    a cycle drop circuit that decreases the frequency of the second clock signal in response to a signal that indicates an increase number of data bits in a frame.

12. The phase locked loop circuit of claim 11 further comprising:
    a divider circuit that decreases the frequency of the second clock signal, wherein the divider circuit is coupled between the cycle drop circuit and the phase detector.

13. The phase locked loop circuit of claim 11 wherein the cycle drop circuit comprises:
    a divider circuit coupled to receive an output signal of the oscillator; and
    a multiplexer coupled to the divider circuit, wherein the multiplexer provides the second clock signal to the second input of the phase detector.

14. A method for adjusting the frequency of a first clock signal using a phase locked loop, the method comprising:
    decreasing the frequency of the first clock signal in response to a signal that indicates less data bits in a frame;
    comparing the phase of the first clock signal to the phase of a second clock signal to provide a phase difference signal;

filtering the phase difference signal to provide a filtered signal; and generating the second clock signal in response to the filtered signal.

15. The method of claim 14 further comprising:
a charge pump circuit and a loop filter to perform pass filtering.

16. The method of claim 14 wherein the phase of the first clock signal is compared to the phase of the second clock signal using a phase detector to provide the phase difference signal.

17. The method of claim 16 further comprising;
increasing the period of the second clock signal using a divider circuit to provide a divided second clock signal; and
selecting the divided second clock signal using a multiplexer in response to a signal that indicates more data bits in a frame and providing the selected clock signal to the phase detector.

18. The method of claim 16 wherein decreasing the frequency of the first clock signal further comprises:
increasing the period of the first clock signal using a first divider circuit to provide a divided first clock signal; and
selecting the divided first clock signal using a multiplexer in response to the signal that indicates less data bits in a frame.

19. The method of claim 18 further comprising:
decreasing the frequency of the divided first clock signal by a first ratio to generate a divided select clock signal, and providing the divided select clock signal to the phase detector.

20. The method of claim 19 further comprising:
decreasing the frequency of the second clock signal by a second ratio to generate a second divided clock signal, and providing the second divided clock signal to the phase detector.

21. The method of claim 20 wherein the first ratio is not equal to the second ratio, and the phase locked loop is a frequency synthesizer.

22. The method of claim 16 wherein decreasing the frequency of the first clock signal further comprises:
increasing the period of the first clock signal using a first divider circuit to provide a first divided clock signal;
increasing the period of the first divided clock signal using a second divider circuit to provide a second divided clock signal;
selecting the second divided clock signal using a multiplexer in response to the signal that indicates less data bits and providing the second divided clock signal to the phase detector;
selecting the first clock signal using the multiplexer in response to a signal that indicates more data bits in a frame and providing the first clock signal to the phase detector; and
selecting the first divided clock signal using the multiplexer absent the signals indicating more or less data bits and providing the first divided clock signal to the phase detector.

23. The method of claim 14 wherein generating the second clock signal in response to the filtered signal further comprises generating the second clock signal using a voltage controlled oscillator.

24. The method of claim 14 wherein the phase locked loop provides the second clock signal to a signal transmitter.

25. A method for adjusting the frequency of a first clock signal using a phase locked loop, the method comprising:
comparing the phase of the first clock signal to the phase of a second clock signal to provide a phase difference signal;
filtering the phase difference signal to provide a filtered signal;
generating the second clock signal in response to the filtered signal; and
decreasing the frequency of the second clock signal in response to a signal that indicates more data bits in a frame.

26. The method of claim 25 further comprising:
a charge pump circuit and a loop filter to perform low pass filtering.

* * * * *